United States Patent [19]

Gopinathan et al.

[11] Patent Number: 4,958,120
[45] Date of Patent: Sep. 18, 1990

[54] DUAL FEEDBACK TUNING METHOD AND APPARATUS

[75] Inventors: Venugopal Gopinathan, New York, N.Y.; Khen-Sang Tan, Plano, Tex.

[73] Assignee: Texas Instruments Incorporated, Dallas, Tex.

[21] Appl. No.: 290,215

[22] Filed: Dec. 27, 1988

[51] Int. Cl.$^5$ .................... H03K 5/00; H03L 7/00
[52] U.S. Cl. ..................... 328/155; 328/109; 328/133; 307/262; 307/511
[58] Field of Search ............... 328/133, 134, 55, 155, 328/109, 165; 331/1 A, 12, 18; 307/262, 511

[56] References Cited

U.S. PATENT DOCUMENTS

| | | | |
|---|---|---|---|
| 4,418,318 | 11/1983 | Swagerty et al. | 328/155 |
| 4,488,108 | 12/1984 | Treise et al. | 328/133 |
| 4,510,463 | 4/1985 | Galani et al. | 328/133 |
| 4,631,491 | 12/1986 | Smithers | 328/155 |

Primary Examiner—Stanley D. Miller
Assistant Examiner—Richard Roseen
Attorney, Agent, or Firm—Raymond E. Fritz, Jr.; Melvin Sharp; James T. Comfort

[57] ABSTRACT

A system (10) is disclosed which tunes a result (14) of a process (12) relative to a reference (16). The system (10) uses two control parameters ($C_1$ and $C_2$) which are controlled by a switch (20). The control parameters ($C_1$ and $C_2$) are controlled such that only one of the two is acting upon the process (12) to alter the result (14) at any one time.

41 Claims, 1 Drawing Sheet

DUAL FEEDBACK TUNING METHOD AND APPARATUS

TECHNICAL FIELD OF THE INVENTION

This invention relates in general to the field of control systems. Specifically, the present invention relates to a method and apparatus for tuning a performance parameter of a system with respect to a given reference level using two feedback controls.

BACKGROUND OF THE INVENTION

In a variety of situations, it is desirable to hold a particular parameter of a system at a constant value. Depending on the nature of the system, a variety of forces can act to make the value of the parameter unstable. In order to maintain the parameter at a constant value, the system must contain active components which react to the forces causing instability in the parameter.

A common method for achieving stability in a parameter is through the incorporation of a feedback mechanism. In its simplest form, a feedback loop samples the changes occurring in the parameter and applies a counteracting force within the system to return the parameter to the desired level.

In electrical systems, a simple negative feedback loop can be achieved in a system by summing into the system a control signal whose value is inversely proportional to the difference in the value of an output signal of the system and a desired reference value of the system. Through the use of simple feedback systems, an output parameter of an electrical circuit can be made to eventually stabilize at a desired level. Also, through the use of simple feedback systems, the circuit, or any system, becomes resistant to error-inducing forces on the system.

In more complicated feedback schemes, where more than one feedback loop is operating at a time, the corrective measures implemented in the feedback loop may occasionally augment the problem. This is due to the fact that the feedback loops can often serve as catalysts for one another, and end up working against one another.

Therefore, a need has arisen for a system and method which can tune a parameter within a complex system containing more than one control loop which marshals the various control elements such that they efficiently control the parameter but do not work against one another.

SUMMARY OF THE INVENTION

In accordance with the present invention, a tuning system is provided which substantially eliminates or reduces disadvantages and problems associated with prior complex feedback systems. The present invention teaches a system and method for providing corrective feedback to a subject system. The present invention provides for the detection of a parameter of the system, and the comparison of that parameter to a desired reference level.

In accordance with one aspect of the present invention, the subject system has two control elements which affect the level of the parameter to be tuned. An important technical advantage of the present invention inheres in the fact that during the tuning process, only one of the control elements is adjusted while the other control element is inhibited from affecting the parameter of the subject system.

In accordance with another aspect of the present invention, a channelling device is provided which inhibits one of the control elements from affecting the subject system while connecting the other control element to the subject system. The channelling device is responsive to the value of the control elements to select which of the two is allowed to affect the subject system.

More specifically, one embodiment of the present invention provides that one of the control elements of the subject system will only affect the parameter of the system by increasing it, while the other control element will only decrease the level of the parameter.

Embodiments of the present invention are applicable in a wide variety of contexts. For example, in an electrical system, the subject system to be tuned could be a filter, an amplifier or any other circuit with an internal or output parameter which needs to be tuned to a constant level. These parameters could be a voltage level, a current level, a phase differential or any other parameter which can be detected and affected by feedback returning to the subject circuit. Likewise, the two control elements could be voltage levels, current levels or any element of the system which could affect the parameter desired to be tuned.

A specific application of the invention to an electrical circuit can be found in a monolithic continuous time filter. In such a filter, a frequency and phase control scheme is required to provide constant bandwidth and constant amplitude responses. Designing a phase control scheme for such a filter is very difficult. Phase control typically requires a circuit which can provide both phase lead and lag by simply varying a control voltage. However, if two separate phase control circuits, with two separate control voltages, are provided, where one provides phase lead and the other provides phase lag, the circuit design is much simplified. Accordingly, one embodiment of the present invention provides a control scheme which is capable of tuning the phase parameter by varying two control voltages.

BRIEF DESCRIPTION OF THE DRAWINGS

A more complete understanding of the present invention may be acquired by referring to the detailed description and claims when considered in connection with the accompanying drawings in which like reference numbers and alphanumeric labels indicate like features, and wherein:

DETAILED DESCRIPTION OF THE INVENTION

Figure 1:
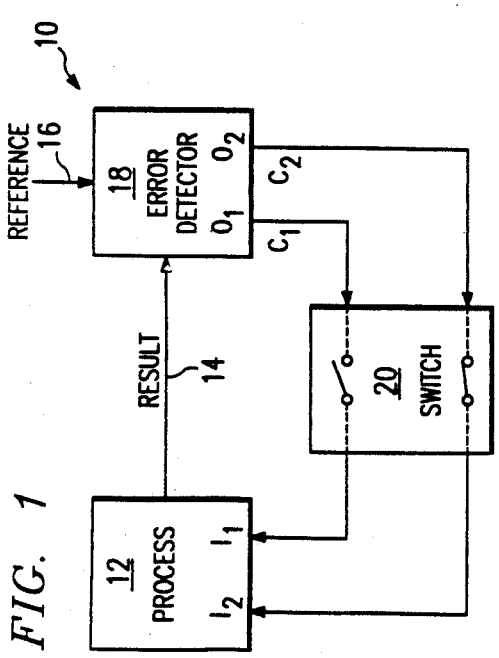
FIG. 1 is a schematic block diagram illustrating a basic feedback structure of the present invention.

FIG. 1 shows a block diagram indicated generally at 10 which illustrates the principles of the present invention. A process 12 produces a result indicated by path 14. The result 14 varies due to forces acting upon process 12. It is however desired that the result 14 be held constant relative to a reference that is input through a path 16.

The result 14 and the reference 16 are input into an error detector 18. Error detector 18 has two outputs, $O_1$ and $O_2$. Error detector 18 detects the difference between result 14 and reference 16, and outputs two correction parameters through outputs $O_1$ and $O_2$. These correction parameters are labeled $C_1$ and $C_2$ on FIG. 1. The correction parameters $C_1$ and $C_2$ are generated to proVide feedback to the process 12 to bring the result 14 to a constant level relative to the reference 16.

The flow of the correction parameters $C_1$ and $C_2$ is controlled by a switch 20. Switch 20 functions to allow only one of the correction parameters to be input into process 12 at a time. The other correction parameter is inhibited by the switch 20 from affecting the process 12. Process 12 is shown on FIG. 1 to have two inputs, $I_1$ and $I_2$, corresponding to the two correction parameters $C_1$ and $C_2$.

In operation, error detector 18 will attempt to correct the result 14 using one of the correction parameters $C_1$ and $C_2$. Switch 20 will then determine if the attempted correction can be accomplished using a selected correction parameter. If switch 20 determines that the attempted correction cannot be made using the correction parameter selected, switch 20 will connect the other correction parameter to the process 12 and inhibit the first correction parameter selected. Thus, only one of the correction parameters $C_1$ and $C_2$ will ever be operating to affect the process 12 at any one point in time. In this manner, the correction parameters $C_1$ and $C_2$ will never be working against each other. Hence, the result 14 can more quickly e brought to a stable level relative to reference 16.

Figure 2:
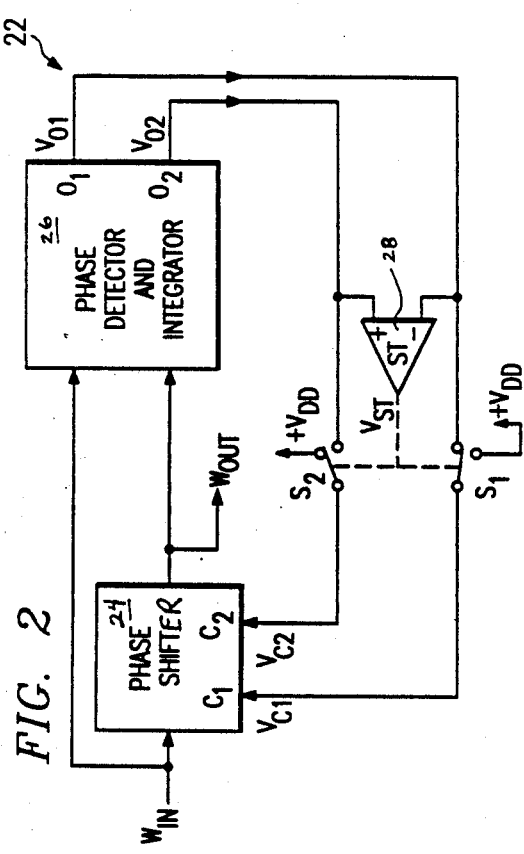
FIG. 2 is a schematic electrical diagram of one circuit embodiment of the present invention.
Figure 4:
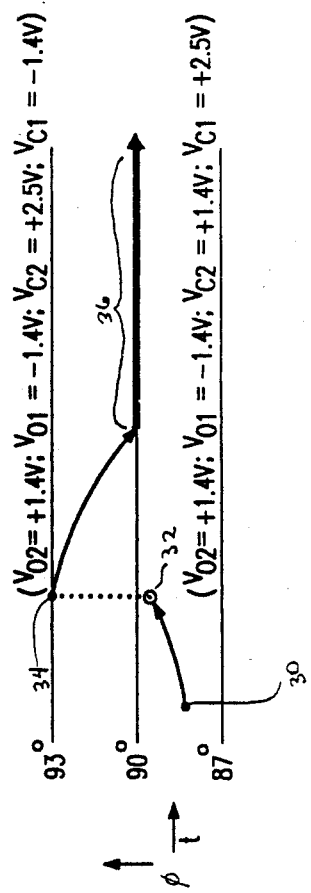
FIG. 4 is a graph of the phase output versus time during the operation of the circuit shown in FIG. 2.
Figure 3:
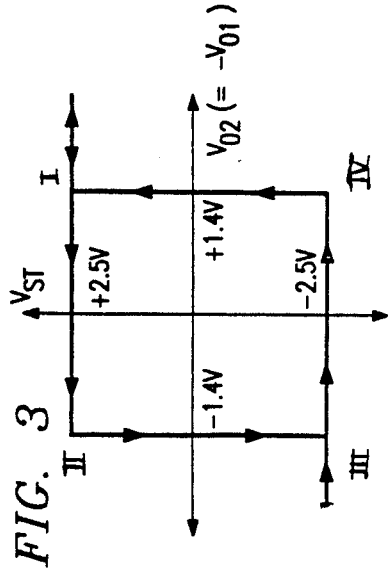
FIG. 3 is a graph of operational parameters of a Schmitt trigger used in the circuit shown phase in FIG. 2.

The principles of the present invention can most easily be understood when they are examined in the context of a particular system implementation. Accordingly, FIG. 2 is a schematic block diagram of an electrical tuning system constructed according to the teachings of the present invention. More specifically, FIGS. 2, 3 and 4 illustrate a hypothetical implementation of a system designed to maintain the phase of a signal $W_{in}$ at 90°.

Referring to FIG. 2, a tuning circuit is indicated generally at 22. The signal to be tuned is indicated by $W_{in}$ and is shown entering a phase shifter 24. Phase shifter 24 is intended to represent a portion of a system using the $W_{in}$ signal Phase shifter 24 axiomatically comprises any error inducing elements which might act on the phase of the signal $W_{in}$. Phase shifter 24 is also assumed to include circuitry by which the phase of the signal $W_{in}$ may be altered through the use of two control elements $C_1$ and $C_2$. These control elements are activated by two input control voltages, $V_{C1}$ and $V_{C2}$. A signal $W_{out}$ exits phase shifter 24. A phase $\phi$ of the signal $W_{out}$ is affected by the error-inducing forces and the control forces input on inputs $C_1$ and $C_2$.

For the purpose of teaching the present invention, assume that the signal $W_{in}$ has the desired 90° phase prior to entering phase shifter 24. Thus, the signal $W_{in}$ can be used as the reference signal relative to the shifted phase of the $W_{out}$ signal. The purpose of the illustrated circuit is therefore the realignment of the phase angle of $W_{out}$ with that of $W_{in}$.

For the purpose of teaching the present invention, the following hypothetical characteristics of the control elements $C_1$ and $C_2$ within phase shifter 24 are assumed. $C_1$ is assumed to be inactive if the voltage $V_{C1}$ is greater than 1.1 volt. $C_2$ is assumed to be inactive if the control voltage $V_{C2}$ is greater than 1.1 volt. Further, it is assumed that as $V_{C1}$ goes below 1.1 volt, the value of $\phi$ will increase. Further, as $V_{C2}$ goes below 1.1 volt, the value of $\phi$ will decrease. It is also assumed that the value of $\phi$, if both $C_1$ and $C_2$ are inactive, will not be further than 3° from the value of the phase of $W_{in}$. More specifically, $\phi$ will be equal to 93° if $V_{C1}$ is equal to $-1.4$ volts and $V_{C2}$ is greater than $+1.1$ volts. Further, $\phi$ will be equal to 87° if $V_{C1}$ is greater than 1.1 volts and $V_{C2}$ is equal to $-1.4$ volts. The system presented in FIG. 2 will tune $\phi$ to 90° if $\phi$ is anywhere between 93° and 87°.

As $V_{C1}$ decreases, $\phi$ will increase in value up to 93°. As $V_{C2}$ decreases, $\phi$ will decrease in value down to 87°. Hence, some values of $\phi$ can only be obtained by altering $C_1$ while other values of $\phi$ can only be obtained by altering control input $C_2$.

Referring back to FIG. 2, the $W_{out}$ signal and the reference signal $W_{in}$ are both input into a phase detector and integrator 26. Phase detector and integrator 26 detects the difference between $\phi$ and the phase of the reference signal $W_{in}$ (assumed to be 90°). Phase detector and integrator 26 further includes two control outputs, $O_1$ and $O_2$. These outputs are used by phase detector and integrator 26 to transmit feedback signals $V_{O1}$ and $V_{O2}$.

It is assumed that phase detector and integrator 26 creates feedback signals with the following characteristics. If $\phi$ is less than 90°, $V_{O1}$ ramps down and $V_{O2}$ ramps up in a differential fashion. Hence, the value of $V_{O1}$ will always be the negative of the value of $V_{O2}$. If $\phi$ is greater than 90°, $V_{O1}$ will ramp up and $V_{O2}$ will ramp down in a similar fashion.

Feedback signals $V_{O1}$ and $V_{O2}$ are input into a Schmitt trigger 28 which controls two switches, $S_1$ and $S_2$. Schmitt trigger 28 uses the feedback signals $V_{O1}$ and $V_{O2}$ to create a switch control signal $V_{ST}$. The operational characteristics of the Schmitt trigger are illustrated in graphic form in FIG. 3. The values of $V_{O2}$ are shown on the ordinate axis, and the values of $V_{ST}$ are shown on the coordinate axis. As can be seen, the Schmitt trigger 28 functions in a manner which roughly resembles a hysteresis loop.

For the purpose of explanation, the graph of FIG. 3 has been divided into four quadrants which are labeled with Roman numerals I through IV. If the Schmitt trigger 28 is in a state graphically depicted in quadrants I or II, the value of the $V_{ST}$ will be $+2.5$ volts for any value of $V_{O2}$ greater than $-1.4$ volts. If the value of $V_{O2}$ decreases to the point that it is equal to $-1.4$ volts, the Schmitt trigger will flip the voltage of $V_{ST}$ to $-2.5$ volts. The value of $V_{ST}$ will remain at $-2.5$ volts, shown in quadrants III and IV, until the value of $V_{O2}$ rises to the level of $+1.4$ volts.

The $V_{ST}$ voltage is used to control the two switches, $S_1$ and $S_2$, in the following manner. When $V_{ST}$ is equal to $+2.5$ volts, the switches are configured as shown in FIG. 2, with $S_1$ in a position to couple the $V_{O1}$ feedback signal to the $C_1$ control input of phase shifter 24. In this configuration, the $S_2$ switch will be in position to connect the $C_2$ control input of phase shifter 24 to the $V_{DD}$ power supply which is equal to $+2.5$ volts. $V_{C2}$ will therefore be equal to $+2.5$ volts and the control input $C_2$ of phase shifter 24 will be inactive.

When $V_{ST}$ is equal to $-2.5$ volts, the switches $S_1$ and $S_2$ will be configured in the opposite manner; $C_1$ will be connected to $V_{DD}$ and $C_2$ will be connected to $O_2$. Because of the characteristics of the Schmitt trigger 28, only one input control $C_1$ or $C_2$ can be active at any one time. Because of this characteristic, convergence of $\phi$ to 90° is possible wherever $\phi$ initially rests. There is no dead zone which is not reachable by the system through the use of the control inputs $C_1$ or $C_2$.

By way of example, FIG. 4 illustrates the most difficult initial condition for the system of FIG. 2 to handle. FIG. 4 is a graph of the $W_{out}$ phase angle versus time. The most difficult $W_{out}$ phase control problem is where the phase of the $W_{out}$ signal is forced in a direction which is opposite to the capabilities of the control input which is currently active.

The initial phase is shown at a point 30 to be approximately equal to 88°. Since the phase must be increased to reach 90°, $C_1$ must be turned on. However, for the purpose of showing the capabilities of the system, the most difficult initial condition will be assumed, that $C_2$ is initially turned on. In this state, the system would have the following characteristics: $V_{ST}$ would be equal to $-2.5$ volts, $V_{O2}$ would be approximately equal to $-1.0$ volts, $V_{O1}$ would be approximately equal to $+1.0$ volts, $V_{C2}$ would be approximately equal to $-1.0$ volts, and $V_{C1}$ would be equal to $+2.5$ volts.

In operation under these conditions, phase detector and integrator 26 would detect that $\phi$ was less than 90°. As a result, $V_{O2}$ would ramp up. Because $V_{ST}$ is equal to $-2.5$ volts, $O_2$ would be connected to $C_2$, and $C_1$ would be inactive. $V_{O2}$ would ramp up until it and $V_{C2}$ were equal to $+1.4$ volts. This state is shown at 32 on FIG. 4, at which $V_{O1}$ would be equal to $-1.4$ volts, $V_{C2}$ would be equal to $+1.4$ volts and $V_{C1}$ would be equal to 2.5 volts.

At this point, the Schmitt trigger would switch the value of $V_{ST}$ to $+2.5$ volts, thereby connecting $O_1$ to $C_1$ and $C_2$ to $V_{DD}$. This second condition is shown in FIG. 4 at 34. State 34 is identical to the state illustrated in FIG. 2. At state 34, $V_{O2}$ would be equal to $+1.4$ volts, $V_{O1}$ would be equal to $-1.4$ volts, $V_{C2}$ would be equal to $+2.5$ volts and $V_{C1}$ would be equal to $-1.4$ volts.

The large jump in the phase between states 32 and 34 is due to the fact that at the instant the Schmitt trigger switches from $C_2$ being active to $C_1$ being active, the feedback control signal $V_{O1}$ would be equal to $-1.4$ volts. This value of $V_{O1}$ results in the phase shifter 24 raising the phase as high as it is capable of doing. At this point in operation, the correct control, $C_1$, is activated, and the negative feedback loop between $O_1$ and $C_1$ would force the phase to settle at 90° as indicated by state 36 shown on FIG. 4.

This example demonstrates that even under the most difficult initial conditions, a system constructed according to the teachings of the present invention can tune a varying parameter of a system to a desired value. As shown by this example, the present invention is useful for phase tuning of electronic filters. However, the system above is presented solely for the purpose of explaining the present invention. The advantages of the present invention are applicable to any subject system which provides two control parameters which can affect a single performance parameter. These and other implementations are intended to be included within the scope of the present invention.

While the invention is illustrated by the embodiments in the above detailed description, it is not limited to these embodiments, but rather only by the scope and spirit of the claims which follow.

What is claimed is:

1. A tuning system for controlling the variance of a varying parameter generated by a subject system, comprising:
   an error detector for receiving said varying parameter and sensing an error between said varying parameter and a reference parameter;
   a first feedback subsystem coupled to said error detector and constantly generating a first control parameter operable to correct a first type of error sensed by said error detector between said varying parameter and said reference parameter;
   a second feedback subsystem coupled to said error detector and constantly generating a second control parameter operable to correct a second type of error sensed by said error detector between said varying parameter and said reference parameter;
   a channelling device coupled to said first and second feedback subsystems for transmitting a selected one of said first and second control parameters to said subject system while inhibiting the transmission of the other of said first and second control parameters thereto in response to predetermined values of said first and second control parameters; and
   a respective control parameter input of said subject system for receiving said selected one of said first and second control parameters and correcting said varying parameter in response thereto.

2. The tuning system of claim 1 wherein said error detector senses said first type of error when said varying parameter is greater than said reference parameter and senses said second type of error when said varying parameter is less than said reference parameter.

3. The tuning system of claim 1, wherein one of said first and second control parameters is operable to increase said varying parameter and the other is operable to decrease said varying parameter.

4. The tuning system of claim 1, wherein said first and said second feedback subsystems cease to alter said values of said first and second control parameters, respectively, when said varying parameter reaches a predetermined value.

5. The tuning system of claim 4, wherein said predetermined value corresponds to said value of said reference parameter.

6. A tuning circuit for controlling the variance of a varying signal generated by a subject circuit, comprising:
   error detection circuitry for receiving said varying signal and for sensing an error between said varying signal and a reference signal;
   first feedback circuitry coupled to said error detection circuitry and constantly generating a first control signal operable to correct a first type of error sensed by said error detection circuitry between said varying signal and said reference signal;
   second feedback circuitry coupled to said error detection circuitry and constantly generating a second control signal operable to correct a second type of error sensed by said error detection circuitry between said varying signal and said reference signal;
   switching circuitry coupled to said first and second feedback circuitries for transmitting a selected one of said first and second control signals to said subject circuit while inhibiting the transmission of the other of said first and second control signals thereto in response to predetermined values of said first and second control signals; and a respective control signal input of said subject circuit for receiving said selected one of said first and second control signals and correcting said varying signal in response thereto.

7. The tuning circuit of claim 6, wherein said error detection circuitry senses said first type of error when said varying signal is greater than said reference signal and senses said second type of error when said varying parameter is less than said reference parameter.

8. The tuning circuit of claim 6, wherein one of said first and second control signals is operable to increase the level of said varying signal and the other is operable to decrease the level of said varying signal.

9. The tuning circuit of claim 6, wherein said first and second feedback circuitries cease to alter said first and second control signals, respectively, when said varying signal reaches a predetermined level.

10. The tuning circuit of claim 9, wherein said predetermined level corresponds to the level of said reference signal.

11. The tuning circuit of claim 6, wherein said subject circuit comprises an amplifier and said varying signal comprises an output signal of said amplifier having a varying amplitude parameter.

12. The tuning circuit of claim 6, wherein said subject circuit comprises a monolithic continuous time filter and said varying signal comprises an output signal of said filter having a varying phase angle.

13. A feedback system for controlling the variance of a varying phase angle of an output of monolithic continuous time filter, comprising:
   a phase detector for receiving said varying phase angle and sensing an error between said varying phase angle and a reference value;
   first feedback circuitry coupled to said phase detector and constantly generating a first control signal operable to correct a first type of error sensed by said phase detector between said varying phase angle and said reference value;
   second feedback circuitry coupled to said phase detector and constantly generating a second control signal operable to correct a second type of error sensed by said phase detector between said varying phase angle and said reference value;
   switching circuitry coupled to said first and second feedback circuitries for transmitting a selected one of said first and second control signals to said filter while inhibiting the transmission of the other of said first and second control signals thereto in response to predetermined values of said first and second control signals; and
   a respective control signal input of said filter for receiving said selected one of said first and second control signals and correcting said varying phase angle in response thereto.

14. The system of claim 13, wherein said first and second control signals comprise voltage levels.

15. The system of claim 13, wherein said first and second control signals are related such that said first control signal is always the negative of said second control signal.

16. The system of claim 13, wherein said switching circuitry comprises a Schmitt trigger responsive to predetermined values of said first and second control signals for switching from transmitting said selected one of said control signals to transmitting the other of said control signals.

17. The system of claim 13, wherein the feedback system functions continuously such that the filter is continuously resistant to forces acting to vary said varying phase angle.

18. The system of claim 13, wherein said first and second feedback circuitries cease to alter said first and second control signals when said varying phase angle reaches a predetermined value.

19. The system of claim 18, wherein said predetermined value corresponds to said reference value.

20. The system of claim 13, wherein one of said first and second control signals is operable to increase the value of said varying phase angle and the other is operable to decrease said the value of said varying phase angle.

21. The system of claim 13, wherein said phase angle detector senses said first type of error when said varying phase angle is greater than said reference value and senses said second type of error when said varying phase angle is less than said reference value.

22. A method for providing corrective feedback to a system, the method comprising the steps of:
   generating a varying parameter by the system;
   comparing the varying parameter to a reference parameter to obtain first and second control parameters;
   selecting one of said first and second control parameters to act on the system in response to said step of comparing;
   transmitting said one control parameter to the system; and
   generating an altered varying parameter by the system in response to receiving said one control parameter.

23. The method of claim 22, and further comprising the steps of:
   selecting the second of said first and second control parameters to act on the system in response to a different result from said step of comparing;
   inhibiting any effect on the system of the first of said first and second control parameters in response to the different result from said step of comparing;
   transmitting the second of the two control parameters to the system; and
   generating an altered varying parameter by the system in response to the second of said first and second control parameters.

24. The method of claim 23, wherein the first of said first and second control parameters is operable to increase the varying parameter and the other is operable to decrease the varying parameter.

25. The method of claim 23, wherein said steps are repeated continuously such that the system is continuously resistant to forces acting to alter the value of the varying parameter.

26. The method of claim 23, wherein the values of said first and second control parameters are altered in response to said step of comparing in order to correct the varying parameter.

27. The method of claim 26, wherein the values of said first and second control parameters are related such that the first of said first and second control parameters is always the negative of the second of said first and second control parameters.

28. The method of claim 26, and further comprising the step of ceasing to alter the values of said first and second control parameters when the varying parameter reaches a predetermined value.

29. The method of claim 28, wherein the predetermined value corresponds to the value of the reference parameter.

30. A method for correcting a varying phase angle of an output of a monolithic continuous time filter, the method comprising the steps of:
   comparing the varying phase angle to a reference value to obtain a result;
   selecting a first of two control signals to act on the filter in response to a result from said step of comparing;
   inhibiting any effect on the filter of a second of the two control signals in response to the result from said step of comparing;
   transmitting the selected control signal to the filter; and
   generating an altered varying phase angle by the filter in response to receiving the selected control signal.

31. The method of claim 30, and further comprising the steps of:
   selecting the second of the two control signals to act on the filter in response to a different result from said step of comparing;
   inhibiting any effect on the system of the first of the two control signals in response to the different result from said step of comparing;
   transmitting the second of the two control signals to the filter; and
   generating an altered varying phase angle by the filter in response to the second of the two control signals.

32. The method of claim 31, wherein said steps are repeated continuously such that the filter is continuously resistant to forces acting to vary the value of the varying phase angle.

33. The method of claim 31, wherein the value of the two control signals are altered in response to said step of comparing in order to correct the varying phase angle.

34. The method of claim 33, wherein the values of the two control signals are related such that the first of the two control signals is always the negative of the second of the two control signals.

35. The method of claim 33, and further comprising the step of ceasing to alter the two control signals when the value of the varying phase angle reaches a predetermined value.

36. The method of claim 35, wherein the predetermined value corresponds to the reference value.

37. The method of claim 31, wherein said step of selecting a first of two control signals further comprises the step of electrically closing a first of two control switches in the path of the first of the two control signals.

38. The method of claim 37, wherein said step of inhibiting any effect on the filter of a second of the two control signals comprises the step of electrically opening a second of the two control switches in the path of the second of the two control signals.

39. The method of claim 38, wherein said step of selecting the second of two control signals further comprises the step of electrically closing the second of the two control switches in the path of the second of the two control signals.

40. The method of claim 39, wherein said step of inhibiting any effect on the filter of the first of the two control signals comprises the step of electrically opening the first of the two control switches in the path of the first of the two control signals.

41. The method of claim 40, wherein the two control switches are coupled to a Schmitt trigger which is coupled to the two control signals and controls the opening and closing of the switches in response to predetermined values of the two control signals.

* * * * *